United States Patent
Jiang et al.

(10) Patent No.: US 10,186,683 B2
(45) Date of Patent: Jan. 22, 2019

(54) FLEXIBLE ORGANIC LIGHT EMITTING DIODE DISPLAY PANEL

(71) Applicant: EVERDISPLAY OPTRONICS (SHANGHAI) LIMITED, Shanghai (CN)

(72) Inventors: Huan Jiang, Shanghai (CN); Hsin-Ju Ho, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 15/138,925

(22) Filed: Apr. 26, 2016

(65) Prior Publication Data
US 2017/0062534 A1    Mar. 2, 2017

(30) Foreign Application Priority Data
Aug. 31, 2015 (CN) .......................... 2015 1 0548354

(51) Int. Cl.
*H01L 29/08* (2006.01)
*H01L 51/52* (2006.01)

(52) U.S. Cl.
CPC .. *H01L 51/5253* (2013.01); *H01L 2251/5338* (2013.01)

(58) Field of Classification Search
CPC .................. H01L 51/5284; H01L 51/5253
USPC ......................................................... 257/40
See application file for complete search history.

(56) References Cited

U.S. PATENT DOCUMENTS

| | | | |
|---|---|---|---|
| 2004/0113550 A1* | 6/2004 | Adachi | H01L 27/3246 313/512 |
| 2013/0146867 A1* | 6/2013 | Kita | H01L 29/786 257/43 |
| 2015/0037916 A1* | 2/2015 | Rohatgi | H01L 51/524 438/28 |
| 2015/0060806 A1* | 3/2015 | Park | H01L 51/5253 257/40 |
| 2015/0144909 A1* | 5/2015 | Byun | H01L 51/5253 257/40 |

FOREIGN PATENT DOCUMENTS

| | | |
|---|---|---|
| CN | 1596561 A | 3/2005 |
| CN | 101819985 A | 9/2010 |
| CN | 101867023 A | 10/2010 |
| CN | 202453603 U | 9/2012 |

(Continued)

OTHER PUBLICATIONS

The 1st Office Action issued in the counterpart CN application, dated Oct. 28, 2016, by the SIPO.

(Continued)

*Primary Examiner* — Ajay K Arora
(74) *Attorney, Agent, or Firm* — Yunling Ren (57) ABSTRACT

A flexible OLED display panel includes: a flexible substrate; an OLED device disposed on the flexible substrate; a first encapsulation layer disposed on the flexible substrate and covering the OLED device; a bank layer disposed on the flexible substrate and surrounding a periphery of the first encapsulation layer, the bank layer including a plurality of noncontinuous bank units that are disposed in a chain form; and a second encapsulation layer disposed on the flexible substrate and covering the first encapsulation layer and the bank layer.

13 Claims, 6 Drawing Sheets

(56) References Cited

FOREIGN PATENT DOCUMENTS

| CN | 102859741 A | 1/2013 |
|---|---|---|
| CN | 103199199 A | 7/2013 |
| JP | H07169567 A | 7/1995 |
| JP | H10312883 A | 11/1998 |

OTHER PUBLICATIONS

The Notice of Allowance issued in the counterpart CN application, dated Jun. 13, 2017, by the SIPO.

* cited by examiner

FLEXIBLE ORGANIC LIGHT EMITTING DIODE DISPLAY PANEL

CROSS-REFERENCE TO RELATED APPLICATIONS

This application is based upon and claims priority to Chinese Patent Application 201510548354.4, filed on Aug. 31, 2015, the entire contents of which are incorporated herein by reference.

TECHNICAL FIELD

The present disclosure relates to the field of semiconductor device, in particular, to a flexible organic light emitting diode (OLED) display panel.

BACKGROUND

OLED display panels have many advantages such as active light emitting, high contrast ratio and having no limitations on view angle over many other display devices. Particularly, flexible OLED display panels are even more advantageous. Flexible OLED display panels are slimmer in volume and lower in power consumption than the devices in the prior, which may facilitate the improvement of the battery life of the device. Meanwhile, based on the characteristics of bendable and good flexibility, its durability is greatly improved over the existing screens, and thus the risk of accidental damage to the device may be reduced. Therefore, flexible OLED display panels have been wildly used in the art of display technology, and will become a mainstream of further OLED display consumption. However, lifespan of OLED elements in the flexible OLED display panel is an important development bottleneck thereof. Accordingly, well water and oxygen resistance of the thin film encapsulation is particularly important to the flexible OLED display panel.

Thin film encapsulation (TFE) process of an organic electroluminescent diode is used in the encapsulation process of flexible OLED display panel, which may improve the encapsulation performance as well as the mechanical performance of the flexible OLED display panel by alternatively depositing plating films between inorganic layers and organic layers. In an example, a thin film without pinhole and with good compactness may be formed by atomic layer deposition (ALD) in the TFE process. Generally, a thin film deposited to a thickness of 50 nm may have a water vapor transmission rate (WVTR) up to 103 g/m$^2$·24 h. However, the ALD has a serious plating film diffusion effect, and if it is not blocked effectively, it may directly contact moisture and react slightly with water to form aluminum salts. In turn, peripheral water and oxygen resistance of the OLED device and thus encapsulation effect of the flexible OLED display panel may be decreased.

In the prior art, a bank layer having a shape of continuous strip shape is generally used to block the diffusion effect of the ALD. However, while developing the flexible OLED display technology, the bank layer may bear different flexural stress at different positions while the flexible OLED display panel is bended, and the bank layer in the area having relatively larger bending degree may be delaminated easily and thereby the encapsulation effect may be decreased.

SUMMARY

According to an aspect of the present disclosure, there is provided a flexible OLED display panel including: a flexible substrate; an OLED device disposed on the flexible substrate; a first encapsulation layer disposed on the flexible substrate and covering the OLED device; a bank layer disposed on the flexible substrate and surrounding a periphery of the first encapsulation layer, the bank layer including a plurality of noncontinuous (discrete) bank units that are disposed in a chain form; and a second encapsulation layer disposed on the flexible substrate and covering the first encapsulation layer and the bank layer.

BRIEF DESCRIPTION OF THE DRAWINGS

Other features, objects and advantages of the present disclosure will become more apparent by describing its non-restrictive embodiments in detail with reference to the drawings.

DETAILED DESCRIPTION

Technical content of the present disclosure will be further described hereinafter with reference to the drawings and embodiments.

The First Embodiment

Figure 1:
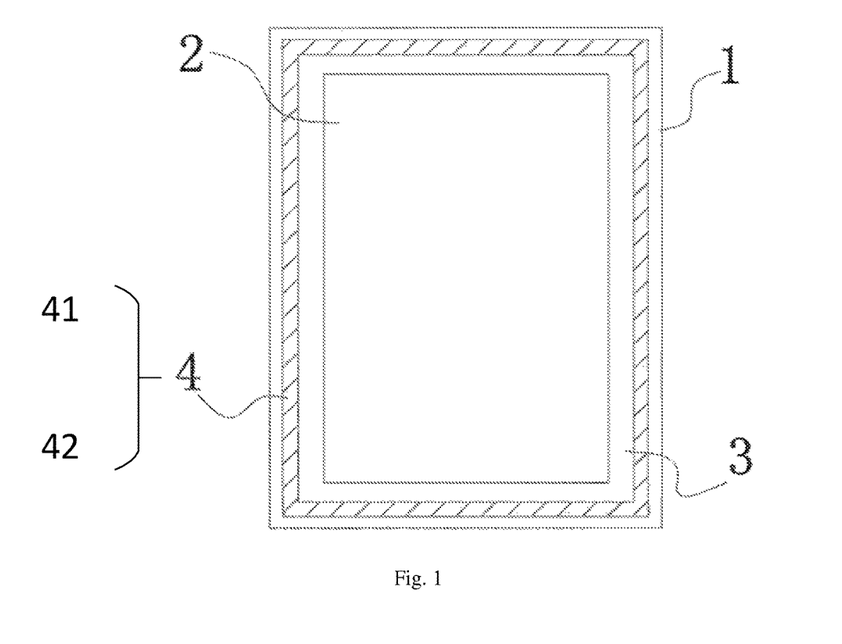
FIG. 1 is a front view of an flexible OLED display panel of a first embodiment of the present disclosure.
Figure 2:
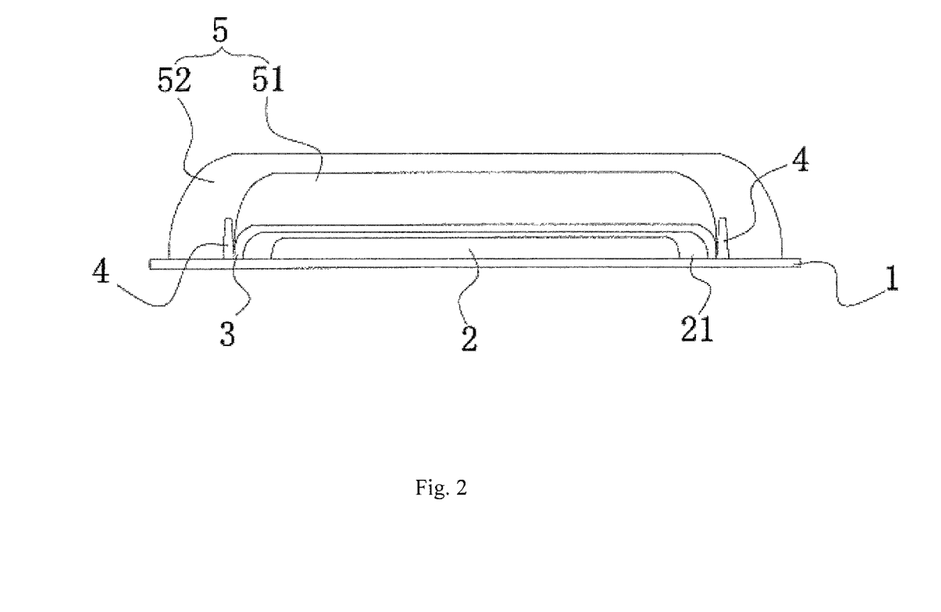
FIG. 2 is a schematic structural diagram of the longitudinal section of the flexible OLED display panel of the first embodiment of the present disclosure.
Figure 3:
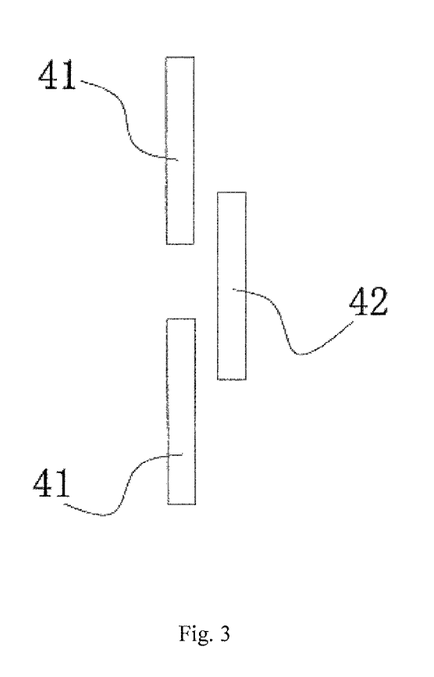
FIG. 3 is a schematic structural diagram of the bank layer of the flexible OLED display panel of the first embodiment of the present disclosure.

Please refer together to FIG. 1 to FIG. 3, which are front view, longitudinal section schematic structural view and schematic structural view of the bank layer of the flexible OLED display panel of the first embodiment of the present disclosure, respectively. In the drawings, the second encapsulation layer is omitted in FIG. 1 for a clear illustration of the structure of the flexible OLED display panel, and the structure of the second encapsulation layer may refer to FIG. 2. As illustrated in FIGS. 1 and 2, in a preferred embodiment of the present disclosure, the flexible OLED display panel includes a flexible substrate 1, an OLED device 2, a first encapsulation layer 3, a bank layer 4 and a second encapsulation layer 5.

As illustrated in FIG. 2, the OLED device 2 is disposed on the flexible substrate 1. The OLED device 2, in an upward direction, includes at least a thin film transistor driving layer, an anode, a light emitting layer and a cathode. In the preferred embodiment illustrated in FIG. 2, the OLED device 2 further includes a light extracting layer 21 which is disposed outside the cathode. It should be noted that in some embodiments, the OLED device 2 may also not include the light extracting layer 21, and in these embodiments, the outmost side of the OLED device 2 is the cathode, which will not be described herein.

The first encapsulation layer 3 is disposed on the flexible substrate 1 and covers the OLED device 2, so as to encapsulate the OLED device 2 and prevent the OLED device 2 from contacting moisture or oxygen. In the embodiment, the wording "cover" means that the first encapsulation layer 3 is disposed at a periphery of the OLED device 2 and on an upper surface of the OLED device 2, and encapsulates the OLED device 2 together with the flexible substrate 1. Preferably, the first encapsulation layer 3 is formed of aluminum oxide material. The first encapsulation layer 3 is formed by atomic layer deposition.

The bank layer 4 serves to block the outward diffusion of the first encapsulation layer 3 at the periphery of the OLED device 2, thereby preventing the first encapsulation layer 3 at the periphery of the OLED device 2 from failing to effectively provide encapsulation effect to the periphery of the OLED device 2. In addition, during the formation of the first encapsulation layer 3, a great amount of the material of the first encapsulation layer 3 (such as aluminum oxide) may be adhered to the used mask with a strong adhesive force, accordingly, if the mask is directly disposed on the flexible substrate 1, there may occur problems such as the mask scratching or crushing the OLED device 2 while being separated from the flexible substrate 1. On the contrary, in the embodiments of the present disclosure, in the manufacturing process of the flexible OLED display panel, the bank layer 4 is formed before the OLED device 2 and simultaneously with the formation of the flexible substrate 1. Accordingly, the bank layer 4 may serve to support the masks during the formation process of the OLED device 2, the first encapsulation layer 3 and the like, thereby preventing the mask from scratching or crushing the OLED device 2.

The bank layer 4 is disposed on the flexible substrate 1 and surrounds the periphery of the first encapsulation layer 3. In the first embodiment illustrated in FIG. 2, the bank layer 4 is preferably formed of polyetherimide material or polyimide material containing N, O and C elements. The bank layer 4 further includes an organic macromolecular polymer overlaying layer with good pressure resistance, tensile resistance, extensibility, bendability and light transmittance, such that the bank layer 4 may have excellent mechanical performance, such as better physical property, lower thermal expansion coefficient and better insulating property. The bank layer 4 is formed on the flexible substrate 1 after exposing, developing and etching using masks. Since the bank layer 4 serves to block the outward diffusion of the first encapsulation layer 3, the bank layer 4 has a height greater than a sum of the thicknesses of the OLED device 2 and the first encapsulation layer 3. Preferably, the bank layer 4 has a height of 3 µm to 4 µm.

In particular, as illustrated in FIG. 3, the bank layer 4 includes a plurality of noncontinuous bank units. The plurality of bank units are disposed in a chain form and surrounds a periphery of the first encapsulation layer 3 to encapsulate the first encapsulation layer 3. In a preferred embodiment of the present disclosure, each of the bank units has a trapezoidal longitudinal section. Preferably, a bottom of the trapezoidal longitudinal section has a width of 40 µm to 60 µm, and an angle between the side of the trapezoidal longitudinal section and the substrate forming the film (i.e., the horizontal direction in FIG. 2) is 20 to 35 degrees.

Figure 4:
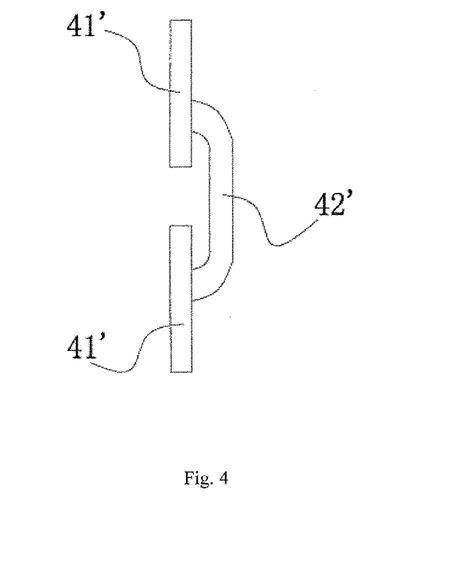
FIG. 4 is a schematic structural diagram of the bank layer of a flexible OLED display panel of a second embodiment of the present disclosure.
Figure 5:
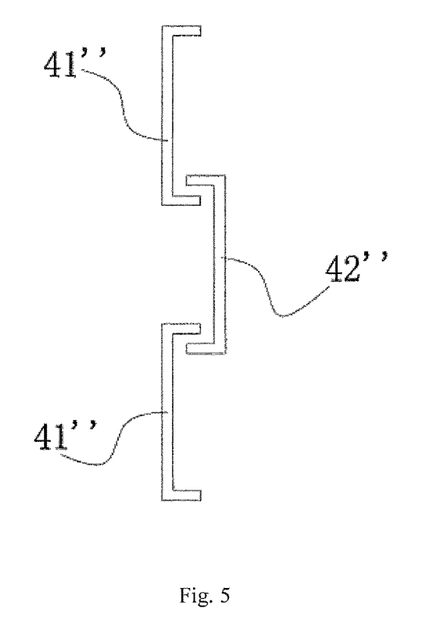
FIG. 5 is a schematic structural diagram of the bank layer of a flexible OLED display panel of a third embodiment of the present disclosure.
Figure 6:
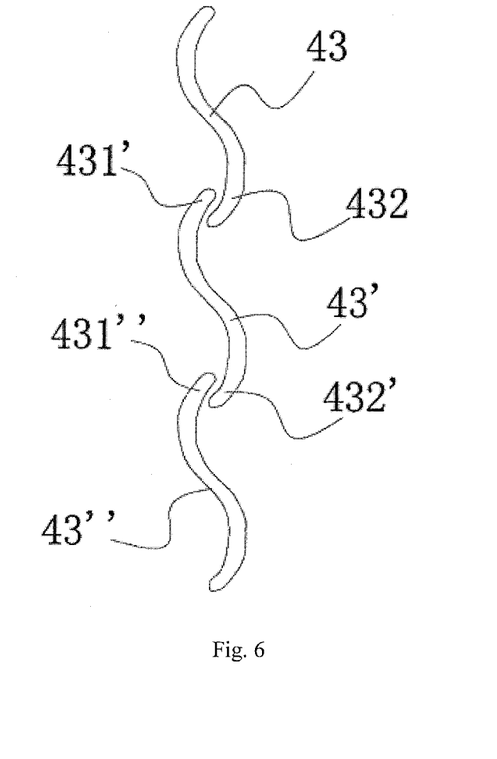
FIG. 6 is a schematic structural diagram of the bank layer of a flexible OLED display panel of a fourth embodiment of the present disclosure.

FIG. 3 is a schematic structural diagram of the bank layer of the flexible OLED display panel of the first embodiment of the present disclosure. In the embodiment, FIG. 3 is a micrographic top view of the bank layer (the structures illustrated in FIGS. 4-6 are also micrographic top views of the bank layer), and in FIG. 3, only a segment of the bank layer 4 in FIG. 1 is described for an example, while the bank layer 4 in FIG. 1 is formed by repeatedly disposing the structure illustrated in FIG. 3. In the first embodiment of the present disclosure, the bank layer 4 includes a plurality of first bank units 41 and a plurality of second bank units 42. The bank layer 4 is formed into a rectangular fractured structure. In particular, taking FIG. 3 for example, the plurality of first bank units 41 are separately arranged to form a first bank circle. The second bank units 42 are separately arranged to form a second bank circle. The second bank circle is disposed at an outer side of the first bank circle. Each of the second bank units 42 is correspondingly disposed between two adjacent ones of the first bank units 41, and the second bank unit 42 has a length greater than a distance between the two adjacent ones of the first bank units 41. In the first embodiment of the present disclosure illustrated in FIG. 3, the first bank unit 41 and the second bank unit 42 are in a strip shape. The first bank circle and the second bank circle have shapes similar to two rectangular dashed line boxes.

It should be noted that the bank layer of the present disclosure is formed of a plurality of noncontinuous bank units, accordingly, in comparison with the bank layer in the prior art having a shape of a continuous strip shape, the plurality of bank units are bendable relative to each other, thereby providing a margin for the stress generated in the first encapsulation layer 3 and the second encapsulation layer 5 contacting the bank layer 4 when the flexible OLED display panel is bent. In addition, the bank layer 4 may have a better flexural stress resistance, thereby increasing the flexibility of the flexible OLED display panel.

The second encapsulation layer 5 is disposed on the flexible substrate 1 and covers the first encapsulation layer 3 and the bank layer 4. The second encapsulation layer 5 includes an organic thin film layer 51 and an inorganic thin film 52. The second encapsulation layer 5 is formed by alternatively depositing the organic thin film layer 51 and the inorganic thin film 52. The organic thin film layer 51 is disposed on the first encapsulation layer 3. Preferably, the organic thin film layer 51 is formed of acrylic based resin material. The inorganic thin film layer 52 is disposed on the flexible substrate 1 and covers the organic thin film layer 51 and the bank layer 4. Preferably, the inorganic thin film layer 52 is formed of silicon nitride material, aluminum oxide material or titanium dioxide material.

The Second Embodiment

Please refer to FIG. 4, which illustrates a schematic structural diagram of the bank layer of a flexible OLED display panel of a second embodiment of the present disclosure. The second embodiment differs from the first embodiment illustrated in FIG. 3 in that the bank layer 4 has a rectangular lapping structure. In particular, taking FIG. 4 for example, in the micrographic top view illustrated in FIG. 4, the first bank unit 41' is in a strip shape and the second bank unit 42' is in a U shape, and each of the U shaped second bank units 42' has both ends lapped with two adjacent ones of the first bank units 41'. The bank layer illustrated in this embodiment may perform similar effect as that of the above first embodiment, which will not be repeated herein.

The Third Embodiment

Please refer to FIG. 5, which illustrates a schematic structural diagram of the bank layer of a flexible OLED display panel of a third embodiment of the present disclosure. The third embodiment differs from the first embodiment illustrated in FIG. 3 in that the bank layer 4 has a U shaped fastening structure. In particular, taking FIG. 5 for example, in the micrographic top view illustrated in FIG. 5, both the first bank unit 41" and the second bank unit 42" are in a U shape. In the embodiment, the U shaped first bank unit 41" and the second bank unit 42" are oppositely disposed. As illustrated in FIG. 5, the wording "oppositely disposed" means that the orientations of the opening of the U shape are opposite. The bank layer illustrated in this embodiment may perform similar effect as that of the above first embodiment, which will not be repeated herein.

The Fourth Embodiment

Please refer to FIG. 6, which illustrates a schematic structural diagram of the bank layer of a flexible OLED display panel of a fourth embodiment of the present disclosure. The fourth embodiment differs from the first embodiment illustrated in FIG. 3 in that the bank layer 4 has a twisted fractured structure. In particular, taking FIG. 6 for example, in the micrographic top view illustrated in FIG. 6, each of the bank units is in an S shape, and the adjacent two bank units are connected end-to-end. Taking the embodiment illustrated in FIG. 6 for example, in the adjacent three bank units 43, 43' and 43", a first end 431' of the middle bank unit 43' extends over a second end 432 of the bank unit 43, and a first end 431" of the bank unit 43" extends over a second end 432' of the bank unit 43'. The bank layer illustrated in this embodiment may perform similar effect as that of the above first embodiment, which will not be repeated herein.

To sum up, with reference to the above embodiments illustrated in FIG. 1 to FIG. 6, the flexible OLED display panel according to the present disclosure uses the bank layer with a plurality of noncontinuous bank units to block the diffusion of the first encapsulation layer and increase the water and oxygen resistance of the first encapsulation layer. The bank layer has a novel structure and may have at least the following advantages: the mask is supported during the formation of the first encapsulation layer, thereby preventing the mask from scratching or crushing the OLED device; the diffusion of the first encapsulation layer is blocked effectively, such that the first encapsulation layer effectively blocks water and oxygen outside the periphery of the OLED device, and the first encapsulation layer, together with the second encapsulation layer, increase the water and oxygen resistance between the periphery of the OLED device and the periphery of the OLED display panel; and the plurality of bank units may be bendable relative to each other, thereby providing a margin for the stress generated in the first encapsulation layer and the second encapsulation layer contacting the bank layer when the flexible OLED display panel is bent, which may be favorable for releasing the stress. Accordingly, delamination or damage of the first encapsulation layer and the second encapsulation layer due to the bending of the flexible OLED display panel may be prevented, thereby preventing the degradation of the water and oxygen resistance effect and increasing the flexibility of the flexible OLED display panel. Meanwhile, penetration path of the water and oxygen may be elongated, thereby increasing the encapsulation effect of the OLED device.

The present disclosure has been described above with reference to the preferred embodiments, however, they are not provided to limit the present disclosure. Various modifications and amendments are available to those skilled in the art without departing the scope and spirit of the present disclosure. Accordingly, the protection scope of the present disclosure is defined only in the claims.

What is claimed is:
1. A flexible organic light emitting diode (OLED) display panel, comprising:
   a flexible substrate;
   an OLED device disposed on the flexible substrate;
   a first encapsulation layer disposed on the flexible substrate and covering the OLED device;
   a bank layer disposed on the flexible substrate and completely surrounding an entire periphery of the first encapsulation layer, the bank layer being composed of a plurality of noncontinuous bank units that are disposed in a chain form; and
   a second encapsulation layer disposed on the flexible substrate and covering the first encapsulation layer and the bank layer.

2. The flexible OLED display panel according to claim 1, wherein the bank layer comprises a plurality of first bank units and a plurality of second bank units:
   the plurality of first bank units are separately arranged to form a first bank circle;
   the plurality of second bank units are separately arranged to form a second bank circle, the second bank circle is disposed at an outer side of the first bank circle, each of the second bank units is correspondingly disposed between two adjacent ones of the first bank units, and the second bank unit has a length greater than a distance between the two adjacent ones of the first bank units.

3. The flexible OLED display panel according to claim 2, wherein both the first bank units and the second bank units are in a strip shape.

4. The flexible OLED display panel according to claim 2, wherein the first bank units are in a strip shape and the second bank units are in a U shape, and each of the second bank units has both ends in contact with the two adjacent ones of the first bank units.

5. The flexible OLED display panel according to claim 2, wherein both the first bank units and the second bank units are in a U shape, and the U shaped first bank units and second bank units are disposed such that orientations of opening of the U shape are opposite.

6. The flexible OLED display panel according to claim 1, wherein each of the bank units is in an S shape, and the adjacent ones of the bank units are overlapped end-to-end.

7. The flexible OLED display panel according to claim 1, wherein the bank layer is formed of polyetherimide material or polyimide material.

8. The flexible OLED display panel according to claim 1, wherein the bank layer has a height of 3 μm to 4 μm.

9. The flexible OLED display panel according to claim 8, wherein each of the bank units has a trapezoidal longitudinal section, and a bottom of the trapezoidal longitudinal section has a width of 40 μm to 60 μm.

10. The flexible OLED display panel according to claim 1, wherein the first encapsulation layer is formed of aluminum oxide material.

11. The flexible OLED display panel according to claim 1, wherein the second encapsulation layer comprises:
   an organic thin film layer disposed on the first encapsulation layer; and
   an inorganic thin film layer disposed on the organic thin film layer and the bank layer and at the outer periphery of the bank layer.

12. The flexible OLED display panel according to claim 11, wherein the organic thin film layer is formed of acrylic based resin material.

13. The flexible OLED display panel according to claim 11, wherein the inorganic thin film layer is formed of silicon nitride material, aluminum oxide material or titanium dioxide material.

* * * * *